(12) United States Patent
Kambayashi et al.

(10) Patent No.: US 8,906,796 B2
(45) Date of Patent: Dec. 9, 2014

(54) METHOD OF PRODUCING SEMICONDUCTOR TRANSISTOR

(75) Inventors: Hiroshi Kambayashi, Yokohama (JP); Akinobu Teramoto, Sendai (JP); Tadahiro Ohmi, Sendai (JP)

(73) Assignee: Tohoku University, Miyagi (JP)

( * ) Notice: Subject to any disclaimer, the term of this patent is extended or adjusted under 35 U.S.C. 154(b) by 0 days.

(21) Appl. No.: 13/582,239

(22) PCT Filed: Mar. 2, 2011

(86) PCT No.: PCT/JP2011/054814
§ 371 (c)(1),
(2), (4) Date: Nov. 6, 2012

(87) PCT Pub. No.: WO2011/108614
PCT Pub. Date: Sep. 9, 2011

(65) Prior Publication Data
US 2013/0052816 A1 Feb. 28, 2013

(30) Foreign Application Priority Data
Mar. 2, 2010 (JP) .................................. 2010-045548

(51) Int. Cl.
| | |
|---|---|
| *H01L 21/3205* | (2006.01) |
| *H01L 29/45* | (2006.01) |
| *H01L 21/285* | (2006.01) |
| *H01L 29/66* | (2006.01) |
| *H01L 21/28* | (2006.01) |
| *H01L 29/20* | (2006.01) |

(52) U.S. Cl.
CPC ..... *H01L 21/28575* (2013.01); *H01L 21/28264* (2013.01); *H01L 29/2003* (2013.01); *H01L 29/452* (2013.01); *H01L 29/66522* (2013.01)

USPC .......................................................... 438/605

(58) Field of Classification Search
USPC .......................................................... 438/605
See application file for complete search history.

(56) References Cited

U.S. PATENT DOCUMENTS 6,806,571 B2 10/2004 Shibata et al.
7,018,915 B2 3/2006 Shibata et al.
(Continued)

FOREIGN PATENT DOCUMENTS

JP 5-3168 A 1/1993
JP 11-330546 A 11/1999
(Continued)

OTHER PUBLICATIONS

Ki Hong Kim, Investigation of Ta/Ti/Al/Ni/Au Ohmic Contact to AlGaN/GaN Heterostructure Field-Effect Transistor, J. Vac. Sci. Technol. B vol. 23 No. 1, 322-326 (Jan. 2005).*

(Continued)

*Primary Examiner* — Anthony Ho
(74) *Attorney, Agent, or Firm* — Lowe Hauptman & Ham, LLP

(57) ABSTRACT

A method of producing a semiconductor transistor involving formation of an ohmic electrode on an active layer composed of a GaN-based semiconductor includes a process of forming a first layer 11 composed of tantalum nitride on an active layer 3 and a second layer 12 composed of Al layered on the first layer 11 and a process of forming ohmic electrodes 9s and 9d in ohmic contact with the active layer 3 by heat treating the first layer 11 and the second layer 12 at a temperature of from 520° C. to 600° C.

6 Claims, 7 Drawing Sheets

(56) References Cited

U.S. PATENT DOCUMENTS

| | | | |
|---|---|---|---|
| 7,989,869 B2 | 8/2011 | Jeong et al. | |
| 8,222,672 B2 | 7/2012 | Kanamura et al. | |
| 2007/0228415 A1* | 10/2007 | Kanamura et al. | 257/192 |
| 2010/0176421 A1 | 7/2010 | Van Hove et al. | |

FOREIGN PATENT DOCUMENTS

| | | | | |
|---|---|---|---|---|
| JP | 2001274459 A | 10/2001 | | |
| JP | 2002359256 A | 12/2002 | | |
| JP | 2006165207 A | 6/2006 | | |
| JP | 2007-273545 A | 10/2007 | | |
| JP | 4268099 B2 | 5/2009 | | |
| JP | 2010-533987 A | 10/2010 | | |
| WO | WO 2009/012536 | * | 1/2009 | H01L 21/338 |

OTHER PUBLICATIONS

An International Search Report, dated May 31, 2011 in International Application No. PCT/JP2011/054814.

* cited by examiner

METHOD OF PRODUCING SEMICONDUCTOR TRANSISTOR

RELATED APPLICATIONS

The present application is based on International Application No. PCT/JP2011/054814, filed Mar. 2, 2011, and claims priority from, Japanese Application Number 2010-045548, filed Mar. 2, 2010.

TECHNICAL FIELD

The present invention relates to a method of producing a semiconductor transistor, and more particularly to a method of producing a semiconductor transistor involving formation of an ohmic electrode in ohmic contact with an active layer composed of a GaN-based semiconductor.

BACKGROUND ART

As a gallium nitride-based semiconductor transistor (hereinafter referred to as a GaN-based semiconductor transistor), a GaN-based semiconductor transistor that has an ohmic electrode composed of Ti/Al on an active layer composed of a GaN-based semiconductor is known (for example, Japanese Patent Application Laid-Open (JP-A) No. 2002-359256). However, there has been a problem that when this GaN-based semiconductor transistor is used in high temperature conditions, electromigration, in which Al layered on Ti diffuses, occurs due to the low melting point of Ti. Thus, an ohmic electrode composed of Ti/Al has poor electrode durability, and it is difficult to ensure reliable operation.

With respect to this problem, JP-A Nos. 2006-165207 and 2007-273545, and Japanese Patent No. 4268099 describe techniques for forming an ohmic electrode composed of Ta/Al, in which Ta, which has a higher melting point than Ti, is used.

SUMMARY OF INVENTION

Technical Problem

However, the Ti/Al electrode and the Ta/Al electrode are both problematic in that Ti and Ta have a tendency to be oxidized. Accordingly, when film formation of Ti (Ta) and Al is performed individually using a single target film formation device, there has been a problem of increased resistance due to the oxidation of the Ti (Ta).

Therefore, it is necessary to consecutively perform film formation of Ti (Ta) and Al using a so-called multi-target film formation apparatus to form the Ti/Al electrode and the Ta/Al electrode. In the multi-target film-formation apparatus, however, sputtering of a target is performed from an oblique direction. Therefore, in the case of a wafer having a large diameter, uniformity of in-plane film thickness and the like of the wafer are adversely affected, thereby reducing yield.

Patent Document 4 describes an ohmic electrode in which MoxGa1-x is formed on TaN. However, formation of the ohmic electrode requires a heating treatment at 700° C. or higher, and there are concerns about the effect of the heat on the GaN-based semiconductor.

An object of the present invention is to provide a method of producing a semiconductor transistor in which an ohmic electrode that makes ohmic contact with an active layer can be formed, with an increased degree of freedom in terms of process.

Solution to Problem

To achieve the object, the present invention provides a method of producing a semiconductor transistor involving formation of an ohmic electrode on an active layer composed of a GaN-based semiconductor, the method including:

a process of forming a first layer composed of tantalum nitride on the active layer and a second layer composed of Al layered on the first layer; and a process of forming the ohmic electrode in ohmic contact with the active layer by heat treating the first layer and the second layer at a temperature of from 520° C. to 600° C.

Advantageous Effects of Invention

The method of producing a semiconductor transistor of the present invention can form an ohmic electrode in ohmic contact with the active layer, with an increased degree of freedom in terms of process.

DESCRIPTION OF EMBODIMENTS

Figure 1A:
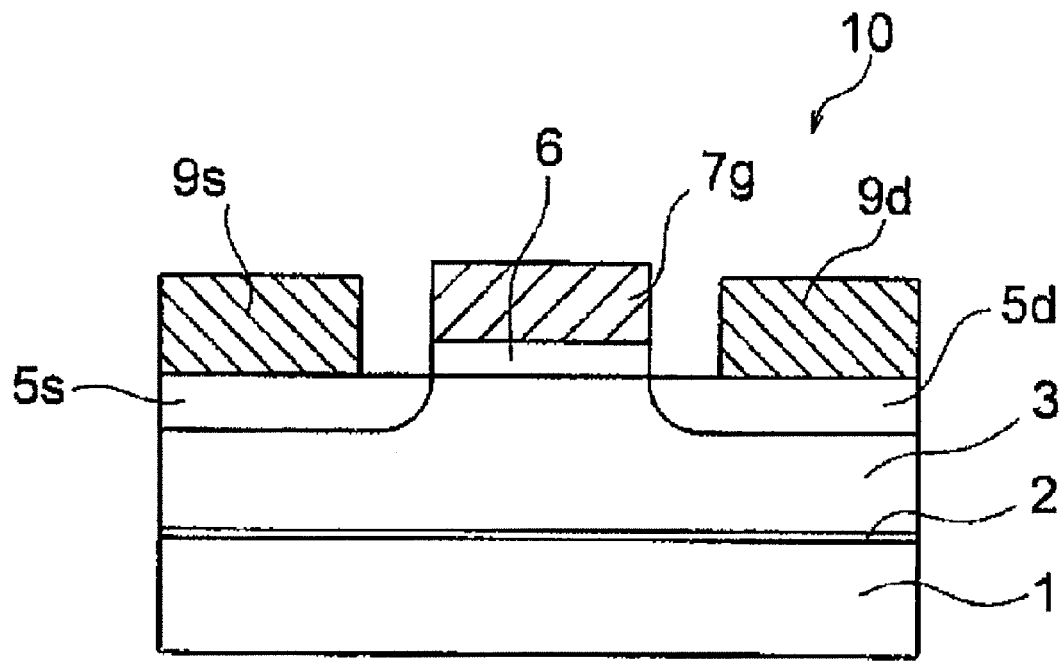
FIG. 1A is a cross-sectional view showing a configuration of the GaN-based semiconductor transistor according to an embodiment of the invention.
Figure 1B:
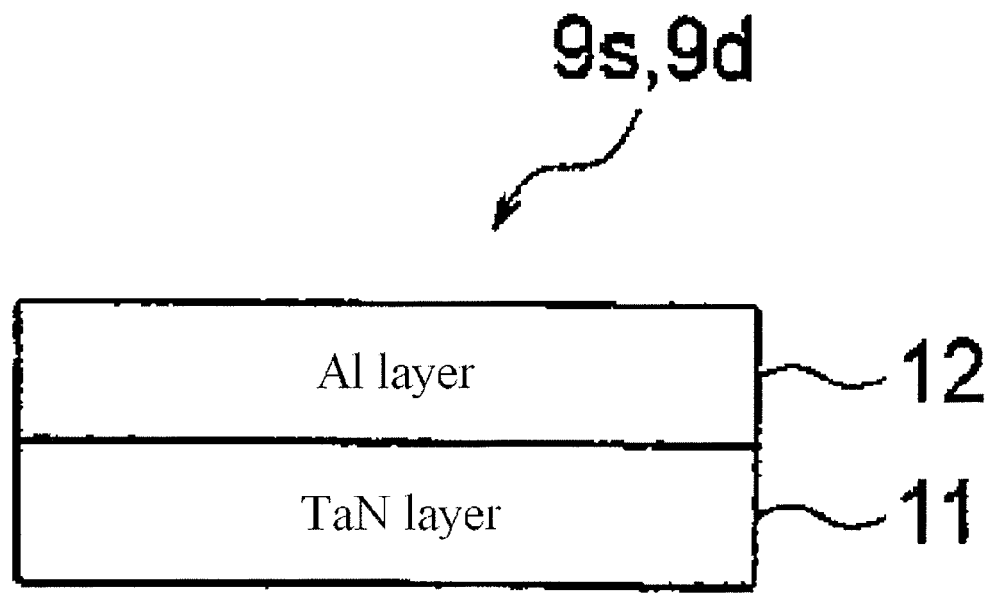
FIG. 1B is a cross-sectional view showing a configuration of the GaN-based semiconductor transistor according to an embodiment of the invention.

Hereinafter, an exemplary embodiment of the present invention is described with reference to the drawings. FIG. 1A and FIG. 1B are each cross-sectional views showing a configuration of a semiconductor transistor according to an embodiment of the invention. A semiconductor transistor 10 is a GaN-based semiconductor transistor having an active layer composed of a GaN-based semiconductor. As shown in FIG. 1A, the semiconductor transistor 10 has a buffer layer 2 formed on a substrate 1, a p-type active layer (p-GaN) 3 formed on the buffer layer 2 using a group III nitride semiconductor, and a gate insulating film 6 composed of a silicon oxide film formed on the active layer 3.

In addition, the semiconductor transistor 10 includes a gate electrode 7g which is provided on the active layer 3 with the gate insulating film 6 therebetween, and a source electrode 9s and a drain electrode 9d. The source electrode 9s and the drain electrode 9d, which are provided suitably for the gate electrode 7g and are in ohmic contact with an n+ type source region 5s and an n+ type drain region 5d of the active layer 3, respectively, are ohmic electrodes.

As shown in 1B, the source electrode 9s and the drain electrode 9d each have a TaN layer (first layer) 11 composed of tantalum nitride (TaN) formed on the n+ type source region 5s and the n+ type drain region 5d of the active layer 3, respectively; and an Al layer (second layer) 12 composed of Al laminated on the TaN layer 11.

In consideration of the use of the GaN-based semiconductor transistor 10 in a high temperature environment, the present inventors have conducted intensive and extensive investigation regarding ohmic electrode formation techniques with a view to suppressing electromigration and improving productivity. As a result, the present inventors have conceived of making the material of the first layer 11 TaN, in which Ta is nitrided to prevent oxidation of Ta, and of layering the Al layer 12 thereon, thereby forming the TaN/Al-based electrode.

Figure 2:
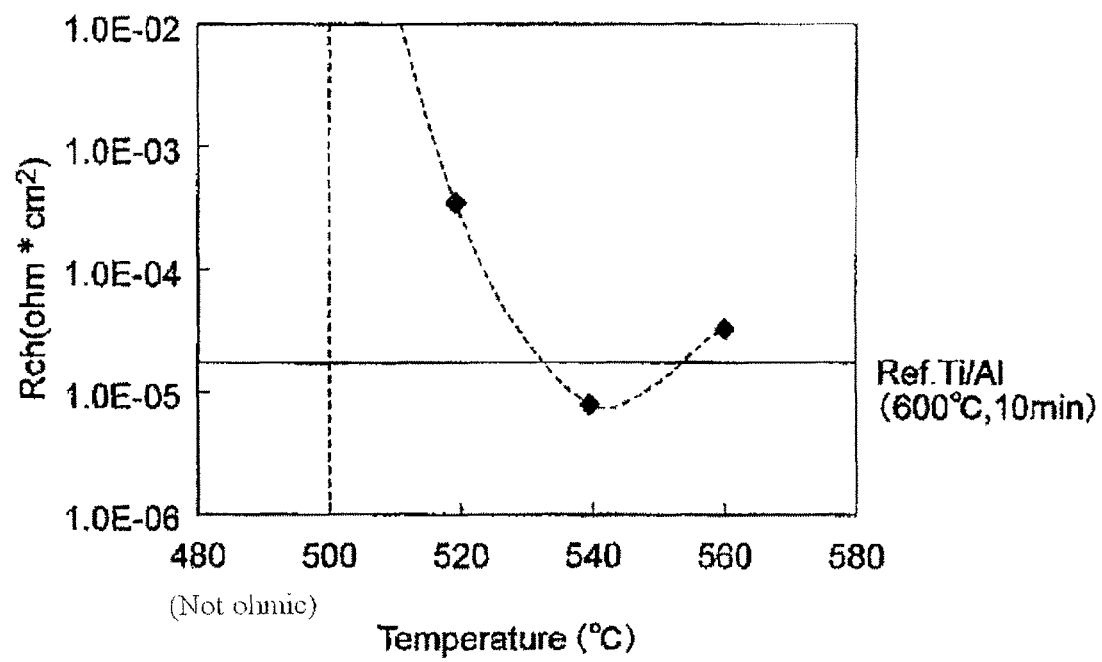
FIG. 2 is a chart showing the relationship between the ohmic characteristics of TaN/Al and the film thickness of TaN.

In addition, the present inventors have found that the ohmic characteristics of the TaN/Al-based electrode depend on the temperature in a heat treatment (annealing) process. FIG. 2 shows the relationship between the annealing temperature represented by the horizontal axis and the resistance Rch represented by the vertical axis, where the annealing time was 1 min. In the chart, for reference purposes, the resistance of the TaN/Al-based electrode in a case of performing annealing for 10 minutes at a temperature of 600° C. is shown. As shown in FIG. 2, the TaN/Al-based electrode had a resistance value of 1.0E-04 $\Omega cm^{-2}$ or less at an annealing temperature of 520° C. or more, and it was apparent that the electrode has ohmic characteristics. In contrast, an upper limit value of the annealing temperature was set to a temperature of 600° C. or less, which does not exceed the melting point of Al.

Figure 3:
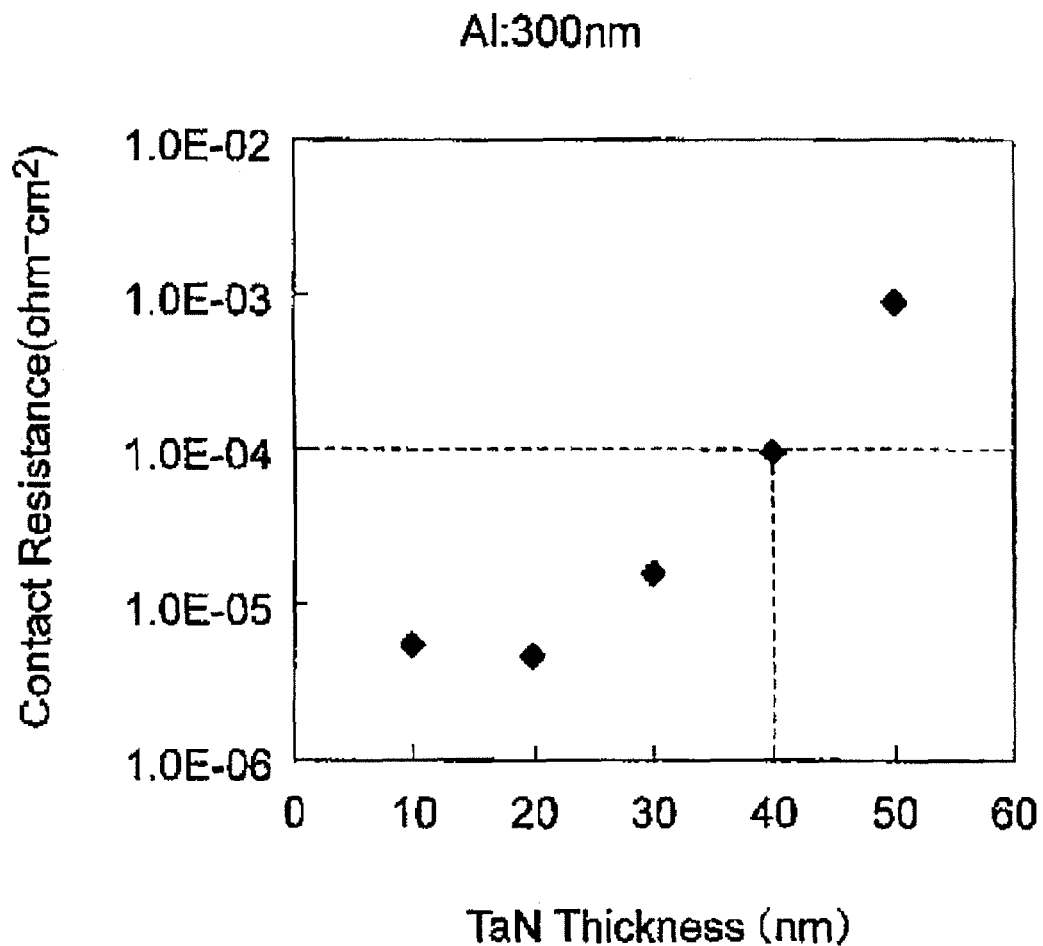
FIG. 3 is a chart showing the relationship between the ohmic characteristics of TaN/Al and the temperature of the heat treatment.

Furthermore, the present inventors have found that the ohmic characteristics of the TaN/Al-based electrode also depend on the film thickness of TaN. FIG. 3 shows the relationship between the film thickness of TaN represented by the horizontal axis and the contact resistance represented by the vertical axis, where the film thickness of the Al layer 12 was set to 300 nm. As shown in FIG. 3, the TaN/Al-based electrode had a contact resistance value of 1.0E-04 $\Omega cm^{-2}$ or less at a film thickness of TaN of 40 nm or less, and it was apparent that the electrode has ohmic characteristics. Herein, as one example, the film thickness of the Al layer 12 was restricted to 300 nm. However, for example, even when the film thickness of the Al layer is set to approximately 200 nm, it is assumed that the TaN/Al-based electrode will have ohmic characteristics as a result of setting the film thickness of TaN to 40 nm or less.

That is, the source electrode 9s and the drain electrode 9d serve as the TaN/Al electrodes, respectively, and are treated with heat at a temperature ranging from 520 to 600° C., and further, the film thickness of the TaN layer 11 is set to, for example, 40 nm or less, whereby ohmic contact with the active layer 3 can be attained.

Figure 4A:
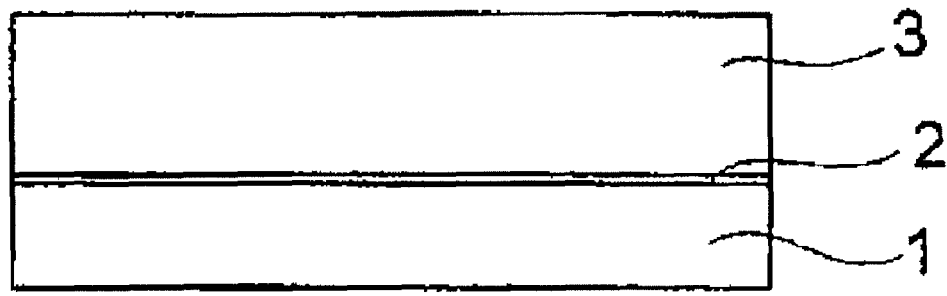
FIG. 4A is a view showing the process of producing the GaN-based semiconductor transistor according to an embodiment of the invention.

Hereinafter, a method of producing the semiconductor transistor 10 is described. First, as shown in FIG. 4A, the buffer layer 2 composed of AlN or GaN and having a thickness of approximately 20 nm and the p-GaN layer 3 having a thickness of approximately 1 μm are sequentially grown on the substrate 1 made of, for example, sapphire, SiC, Si, GaN, or the like, by a metal organic chemical vapor deposition (MOCVD) method. For example, Mg is used as p-type dopant, and the dopant concentration is set to, for example, $1 \times 10^{16}$ to $1 \times 10^{17}/cm^3$. The growth of GaN or the like on the substrate 1 is not limited to the MOCVD method and other growth methods such as a hydride vapor phase epitaxy (HVPE) method or a molecular beam epitaxy (MBE) method may be used.

Figure 4B:
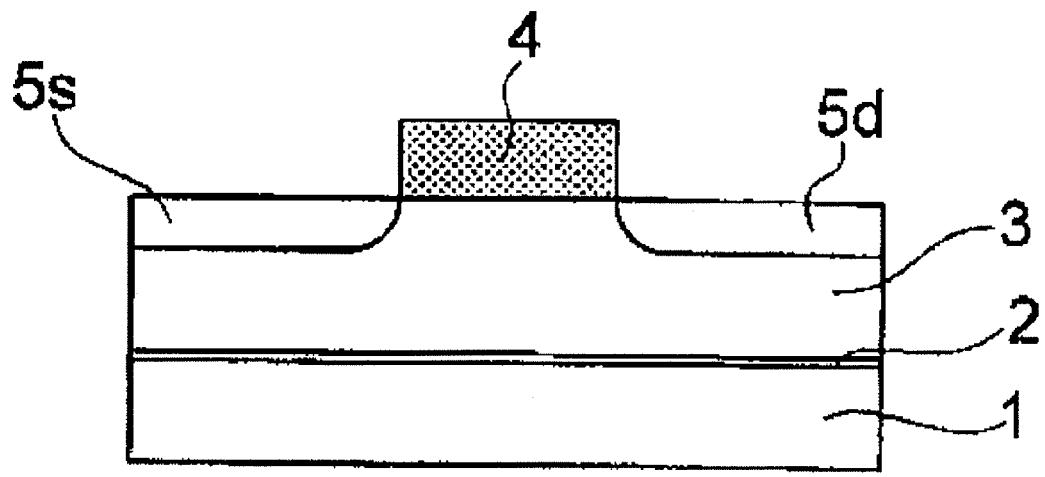
FIG. 4B is a view showing the process of producing the GaN-based semiconductor transistor according to an embodiment of the invention.

Next, as shown in FIG. 4B, a photoresist 4 is applied to the p-GaN layer 3, and exposed to light and developed to form openings in each of a source region and a drain region. After that, through the openings, an n-type dopant such as silicon is injected to form the n+ type source region 5s and the n+ type drain region 5d. In this case, the concentration of the n-type dopant is set to, for example, $1 \times 10^{18}$ to $2 \times 10^{20}/cm^3$.

Figure 4C:
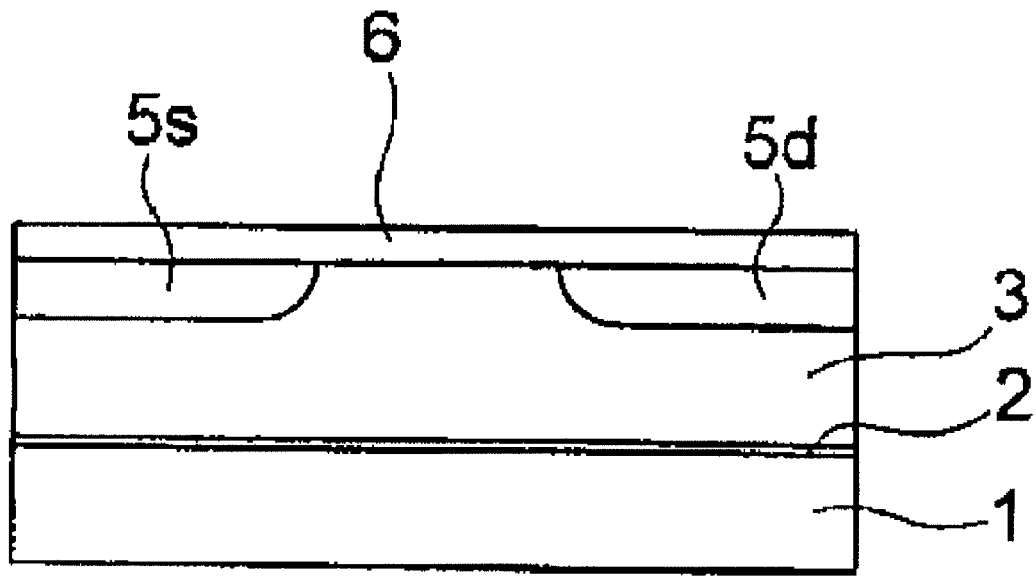
FIG. 4C is a view showing the process of producing the GaN-based semiconductor transistor according to an embodiment of the invention.

After the photoresist 4 is removed with a solvent, as shown in FIG. 4C, for example, a silicon oxide film ($SiO_2$ film) 6 is formed so as to have a thickness of approximately from 50 nm to 100 nm by a plasma-free catalytic chemical vapor deposition (Cat-CVD) method.

Figure 5A:
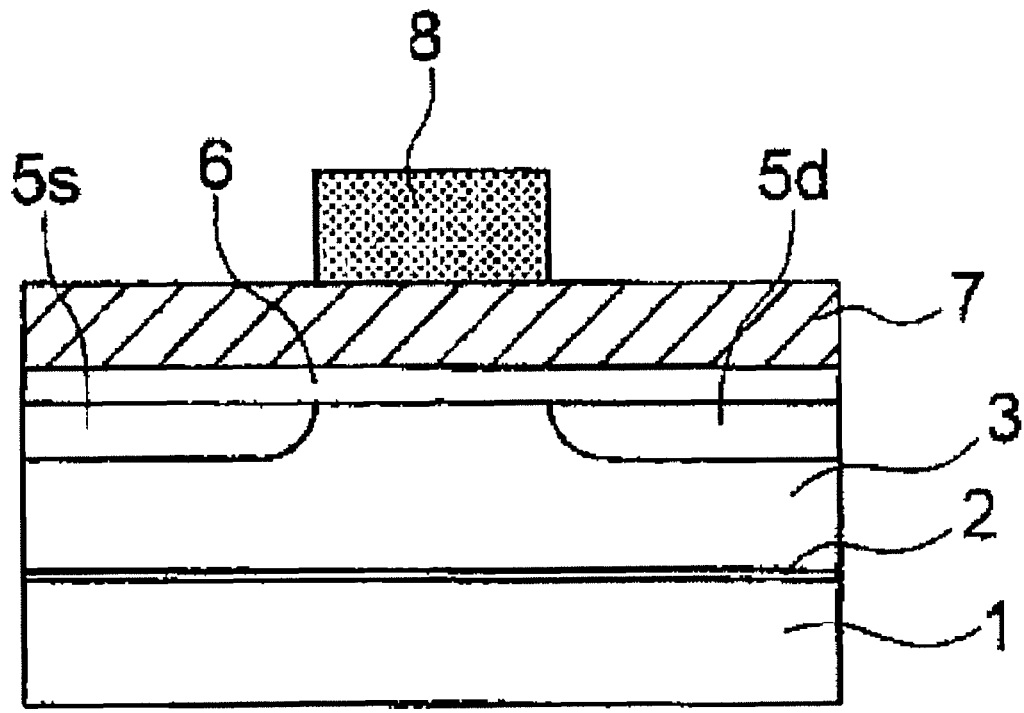
FIG. 5A is a view showing the process of producing the GaN-based semiconductor transistor, following on from FIG. 4.

Next, as shown in FIG. 5A, a conductive film 7 is formed on the silicon oxide film 6. Polysilicon is generally used for the conductive film 7, but the conductive film 7 is not restricted thereto, and may be a metal film such as Ni/Al or WSi. In the case of using polysilicon, As, P (phosphorous), B (boron), or the like is doped and polysilicon is grown by the CVD method, whereas, in the case of a metal film, it is formed by sputtering or the like.

Furthermore, a photoresist 8 is applied to the conductive film 7 and is exposed to light and developed, as a result of which the photoresist 9 remains in the gate region but is removed from the source region 5s and the drain region 5d.

Figure 5B:
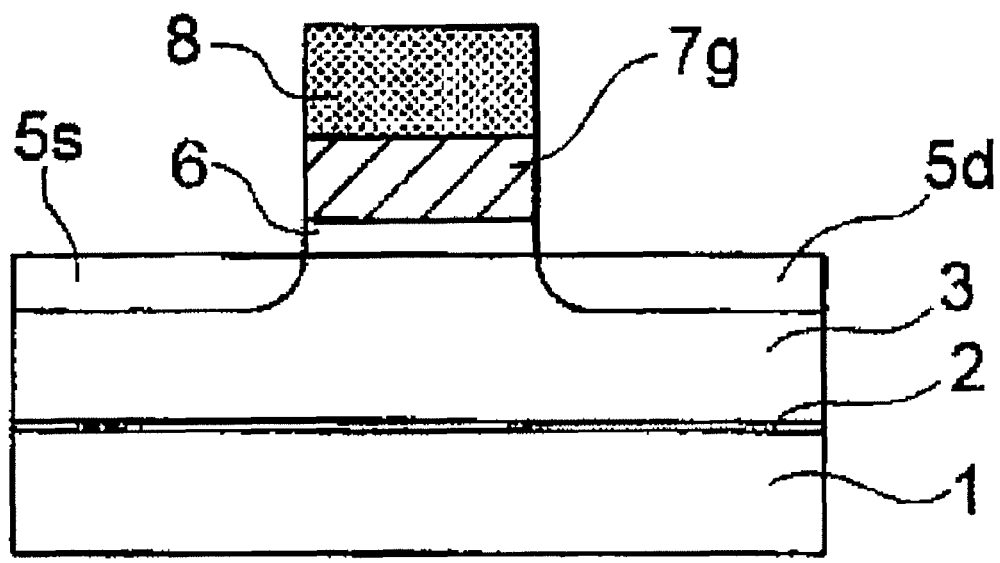
FIG. 5B is a view showing the process of producing the GaN-based semiconductor transistor, following on from FIG. 4.

Then, as shown in FIG. 5B, using the patterned photoresist 8 as a mask, etching is performed on the conductive film 7 and the silicon oxide film 6, and the conductive film 7 left on the gate region serves as the gate electrode 7g. The silicon oxide film 6 under the gate electrode 7g serves as the gate insulating film.

Figure 5C:
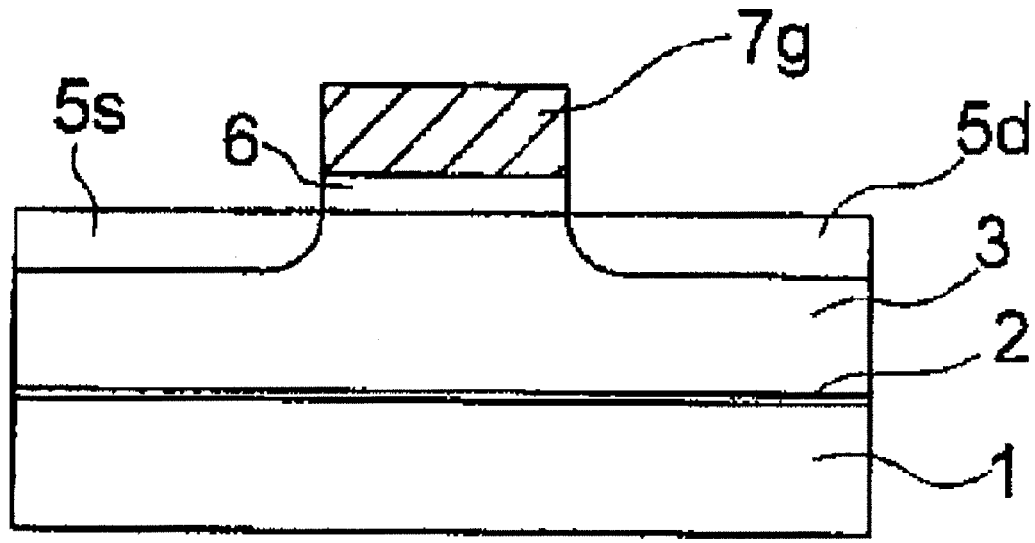
FIG. 5C is a view showing the process of producing the GaN-based semiconductor transistor, following on from FIG. 4.

Next, as shown in FIG. 5C, the photoresist 8 is removed, and then, as shown in FIG. 1B, the TaN layer 11, which is to be the first layer in the source electrode 9s and the drain electrode 9d, is formed on the source region 5s and the drain region 5d by a facing target sputtering (facing sputtering) method. Next, by vacuum deposition, the Al layer 12, which is to be the second layer in the source electrode 9s and the drain electrode 9d, is formed on the TaN layer. Herein, the film thickness of the Al layer 12 was set to approximately 300 nm and the film thickness of the TaN layer 11 was set to 40 nm or less. Then, heat treatment was performed in the range of from 520 to 600° C. In this manner, each of the source electrode 9s and the drain electrode 9d can be in ohmic contact with the n+ GaN layer that forms the drain region 5d and the source region 5s. Through the above processes, the semiconductor transistor 10 shown in FIG. 1A can be produced.

In the method of producing the semiconductor transistor 10 according to an embodiment of the invention, the first layer 11 in the source electrode 9s and the drain electrode 9d is made of tantalum nitride and thus is hardly oxidized. Accordingly, consecutive film formation of the first layer 11 and the second layer 12 is not necessary, and the first and the second layers 11 and 12 each can be film-formed by a single-target film formation apparatus. Since a multi-target film formation apparatus performs sputtering from an oblique direction, film quality tends to be poorer compared to the single-target film formation apparatus. Particularly, when a wafer having a large diameter is used, there has been a problem of reduced yield.

Thus, in the method of producing the semiconductor transistor 10 according to an embodiment of the invention, the first layer 11 and the second layer 12 can be individually film-formed by the single-target film formation apparatus, whereby process flexibility is increased, and productivity can be improved. In addition, by performing the heat treatment in the range of from 520 to 600° C. and by setting the film thickness of the first layer 11 to 40 nm or less, each of the source electrode 9s and the drain electrode 9d can be an ohmic electrode that are in ohmic contact with the source region 5s and the drain region 5d, respectively. Furthermore, since the first layer 11 is made of tantalum nitride, electromigration can be suppressed even in a high temperature environment.

Figure 6A:
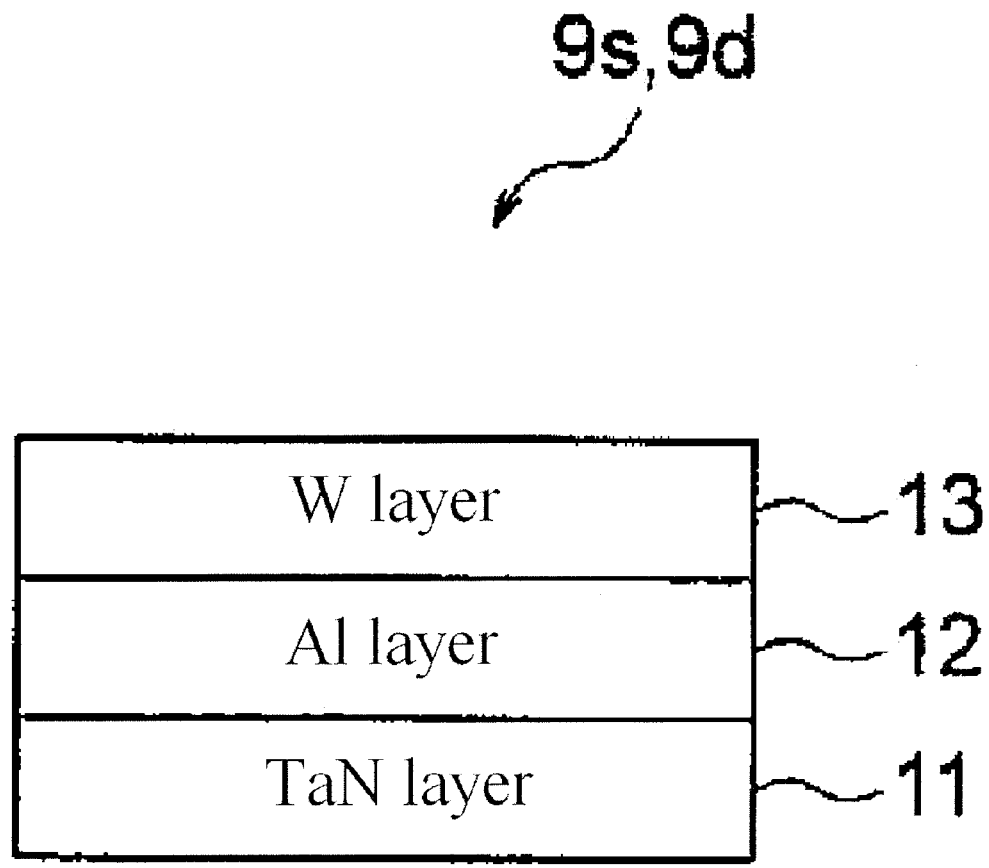
FIG. 6A is a cross-sectional view showing a configuration of another ohmic electrode.
Figure 6B:
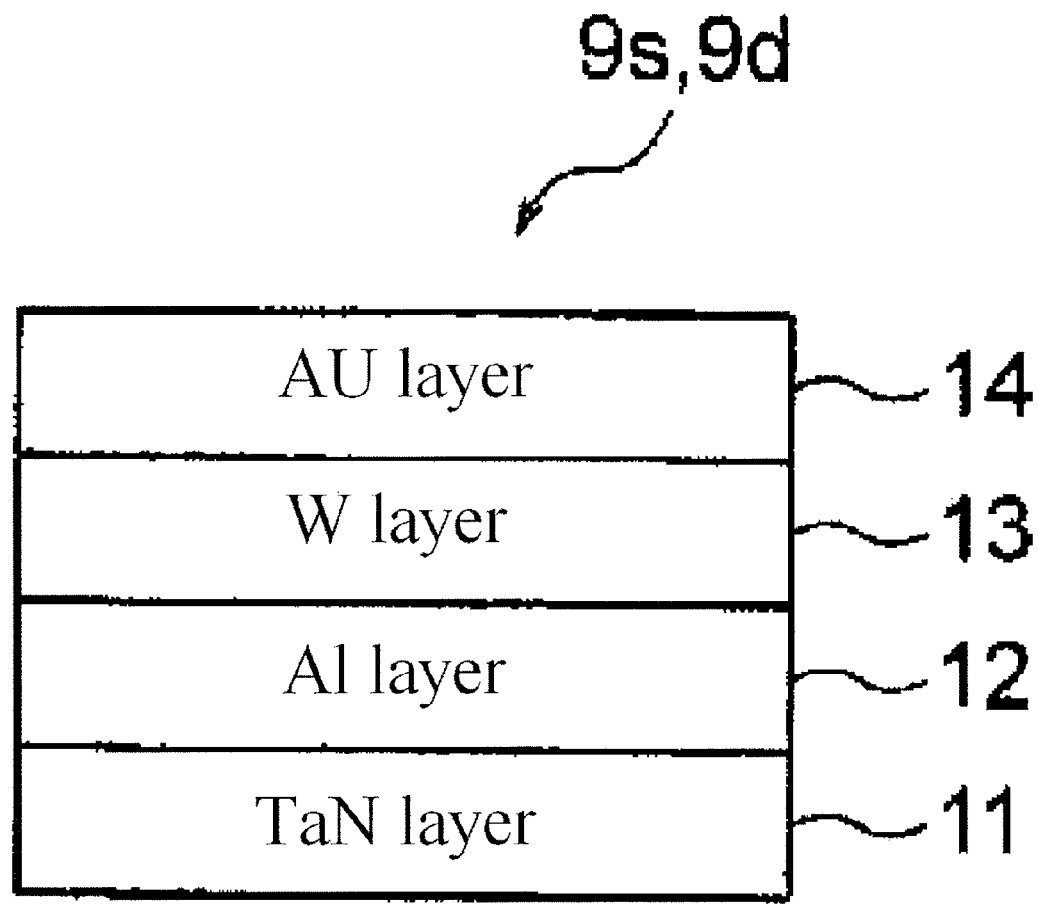
FIG. 6B is a cross-sectional view showing a configuration of another ohmic electrode.

FIG. 6A and FIG. 6B are each cross-sectional views showing another configuration of the source electrode 9s and the drain electrode 9d. In FIG. 9A, a third layer 13 composed of W is formed on the second layer 12. Herein, the third layer 13 is not restricted to W and may be made of any one material selected from Ni, Pd, Mo, Ta, Ti, TaN, and TiN. In the source electrode 9s and the drain electrode 9d shown in FIG. 6A, formation of the third layer 13 reduces resistance of the metal itself, and can reduce resistance of the semiconductor transistor 10.

In FIG. 6B, a fourth layer 14 composed of Au is formed on the third layer 13. In the source electrode 9s and the drain electrode 9d shown in FIG. 6B, when Au is provided on the third layer 13, diffusion of Au is prevented. Additionally, since Au is provided on the surface, it is preferable, for example, to perform bonding or the like.

Hereinabove, the present invention has been described based on a preferable embodiment. However, the method of producing a semiconductor transistor according to the present invention is not restricted simply to the configuration of this embodiment, and various changes and modifications in the configuration of the embodiment are also encompassed in the scope of the invention.

The entire disclosure of Japanese Patent Application No. 2010-045548 is incorporated herein by reference.

All publications, patent applications, and technical standards described in the present specification are incorporated herein by reference to the same extent as if each publication, patent application, or technical standard was specifically and individually indicated to be incorporated by reference.

The invention claimed is:

1. A method of producing a semiconductor transistor comprising an ohmic electrode on an active layer comprising a GaN-based semiconductor, the method comprising:
   forming a first layer comprising tantalum nitride on the active layer and a second layer comprising Al on the first layer; and
   thereafter heat treating the first and second layers at a temperature in a range from 520° C. to 600° C. to form the ohmic electrode in contact with the active layer.

2. The method according to claim 1, wherein a thickness of the first layer is 40 nm or less.

3. The method according to claim 1, further comprising forming a third layer composed of one member selected from the group consisting of W, Ni, Pd, Mo, Ta, Ti, TaN, and TiN on the ohmic electrode.

4. The method according to claim 3, further comprising forming a fourth layer composed of Au on the third layer.

5. The method according to claim 1, further comprising forming a third layer composed of one member selected from the group consisting of W, Pd, Mo, Ti, and TiN on the ohmic electrode.

6. The method according to claim 1, further comprising forming a third layer composed of one member selected from the group consisting of W, Pd, Mo, Ta, Ti, TaN, and TiN on the ohmic electrode.

\* \* \* \* \*